United States Patent [19]

Cross et al.

[11] Patent Number: 5,848,237
[45] Date of Patent: Dec. 8, 1998

[54] PROGRAMMABLE DIGITAL FILTER FOR STABLE INTERVAL DETECTION

[75] Inventors: Leonard Cross, Portland; David W. Bogardus, Hillsboro, both of Oreg.

[73] Assignee: Intel Corporation, Santa Clara, Calif.

[21] Appl. No.: 648,320

[22] Filed: May 15, 1996

[51] Int. Cl.[6] .................................................. G06F 13/00
[52] U.S. Cl. ........................ 395/183.1; 371/47.1; 371/48; 371/61
[58] Field of Search ..................... 395/183.01, 183.13, 395/183.1; 324/115, 128, 126; 364/724.11, 724.2, 572, 550, 825; 370/350; 375/343; 371/67.1, 69.1, 47.1, 48, 61

[56] References Cited

U.S. PATENT DOCUMENTS

| | | | |
|---|---|---|---|
| 3,626,298 | 12/1971 | Paine | 325/321 |
| 4,137,532 | 1/1979 | Taylor et al. | 343/7.7 |
| 5,068,813 | 11/1991 | Thoen | 364/572 |
| 5,450,452 | 9/1995 | Kakuishi et al. | 375/376 |
| 5,719,580 | 2/1998 | Core | 342/100 |

Primary Examiner—Robert W. Beausoliel, Jr.
Assistant Examiner—Norman Michael Wright
Attorney, Agent, or Firm—Blakely, Sokoloff, Taylor & Zafman LLP

[57] ABSTRACT

A programmable digital filter. The digital filter detects a predefined pattern over a programmably variable duration. The filter includes an interval register which is coupled to receive an interval count. A sample register is coupled to receive a plurality of samples of an input signal which is sampled at an interval determined by the interval count. A plurality of pattern matching circuits generate a pattern match output if the plurality of samples matches one of a plurality of predetermined patterns, and a state logic circuit generates a signal if a new match is found. The pattern matching circuits may be stable high and stable low test circuits which cooperate to determine if all of the plurality of samples are of a consistent logic value.

27 Claims, 3 Drawing Sheets

PROGRAMMABLE DIGITAL FILTER FOR STABLE INTERVAL DETECTION

FIELD OF THE INVENTION

The present invention pertains to the field of digital filtering. More specifically, the present invention relates to a programmable digital filter which may be used in a peripheral device in a computer system.

BACKGROUND

Digital filters are commonly used in processing digital data streams such as converted analog signals. Such digital filters often utilize a series of taps or weights assigned to each value in a series of data. These types of digital filters usually remove or accentuate certain characteristics in the series of data. Additionally, these filters are often used in performing complex calculations for detecting certain conditions within the series of data.

Such elaborate digital filters are often justified in an intensive signal processing environment; however, in other environments, the need to minimize hardware and computational overhead militates against usage of such elaborate filters. Additionally, a predetermined pattern, rather than a complicated mathematical relationship may definitively relay desired information. For example, a true change of state of a mechanical switch may be detected by an appropriately captured sequence of equal samples. Other examples involve detection of any predetermined pattern which may have a varying time base.

The example of a mechanical switch illustrates the difficulty in developing an efficient digital filter which recognizes a predetermined pattern of a varying duration. The physical contact bounce inherent in mechanical switches causes the switch output to falsely indicate the improper switch value for significant intervals. Each of these intervals could potentially be interpreted as a stable state if the filter performs insufficient sampling and/or comparison. Further, noise spikes caused by the switch's sudden physical disconnect affect the interval necessary to avoid detection of false transitions.

Physical characteristics of the switch tend to dictate both noise spikes and the bounce duration. In previous approaches, debounce filter characteristics were fixed in hardware and not necessarily suited to a variety of input stimuli. While ultimately one fixed filter may function appropriately, use of a single fixed filter at least disadvantageously complicates experimental determination of the necessary filter characteristics. Further, the use of a fixed filter precludes adjustment for compatibility with new connections having different signaling characteristics. These drawbacks are of particular concern in a computer system where broad compatibility is crucial and spurious interrupts could result from improper filtering of incoming signals.

Thus, the prior art does not adequately address the need for a programmable digital filter which performs detection of a predetermined pattern. Further, the prior art fails to demonstrate a programmable digital filter which maskably indicates an input transition between stable states to a computer system.

SUMMARY

A digital filter of the present invention detects a predefined pattern over a programmably variable duration. The filter includes an interval register which is coupled to receive an interval count. A sample register, which may be in the form of a shift register, is coupled to receive a plurality of samples of an input signal sampled at an interval determined by the interval count. A plurality of pattern matching circuits generate a pattern match output if the plurality of samples matches one of a plurality of predetermined patterns, and a state logic circuit generates a signal if a new match is found.

The digital filter may also include an input normalization circuit which may programmably normalize the input signal. The pattern matching circuits may be stable high and stable low test circuits which cooperate to determine if all of the plurality of samples are of a consistent logic value. As such the digital filter could be used to detect a stable change of state of the input signal.

BRIEF DESCRIPTION OF THE FIGURES

The present invention is illustrated by way of example and not limitation in the figures of the accompanying drawings.

DETAILED DESCRIPTION

The present invention provides a digital filtering method and apparatus for stable interval detection. In the following description, numerous specific details are set forth such as sampling intervals, register sizes, and clock rates in order to provide a more thorough understanding of the present invention. It will be appreciated, however, by one skilled in the art that the present invention may be practiced without such specific details. In other instances, control structures and gate level circuits have not been shown in detail in order to not obscure the invention. Those of ordinary skill in the art, with the described functions, will be able to implement the necessary logic circuits without undue experimentation.

Figure 1:
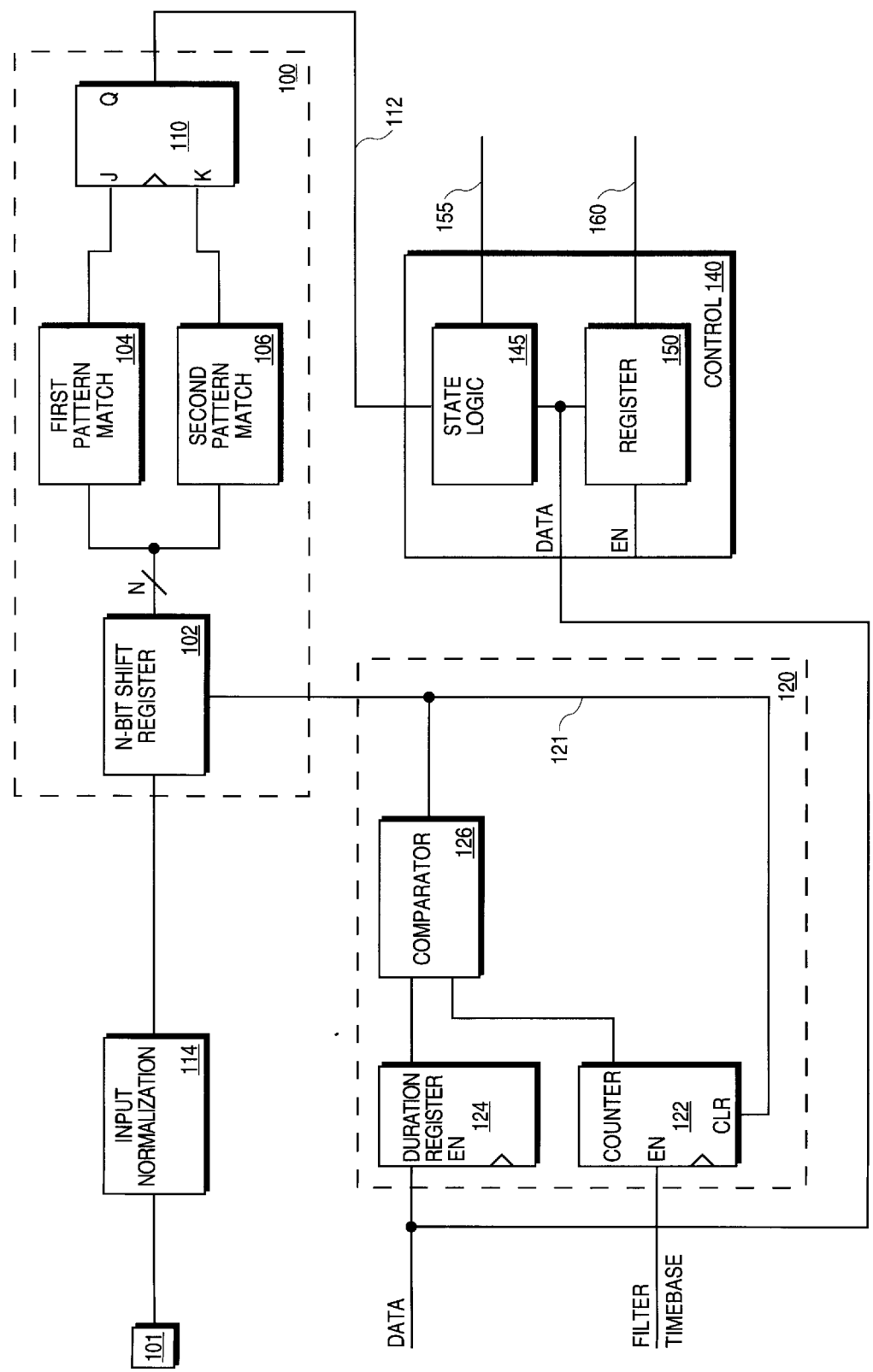
FIG. 1 illustrates a programmable digital filter of the present invention.
Figure 2:
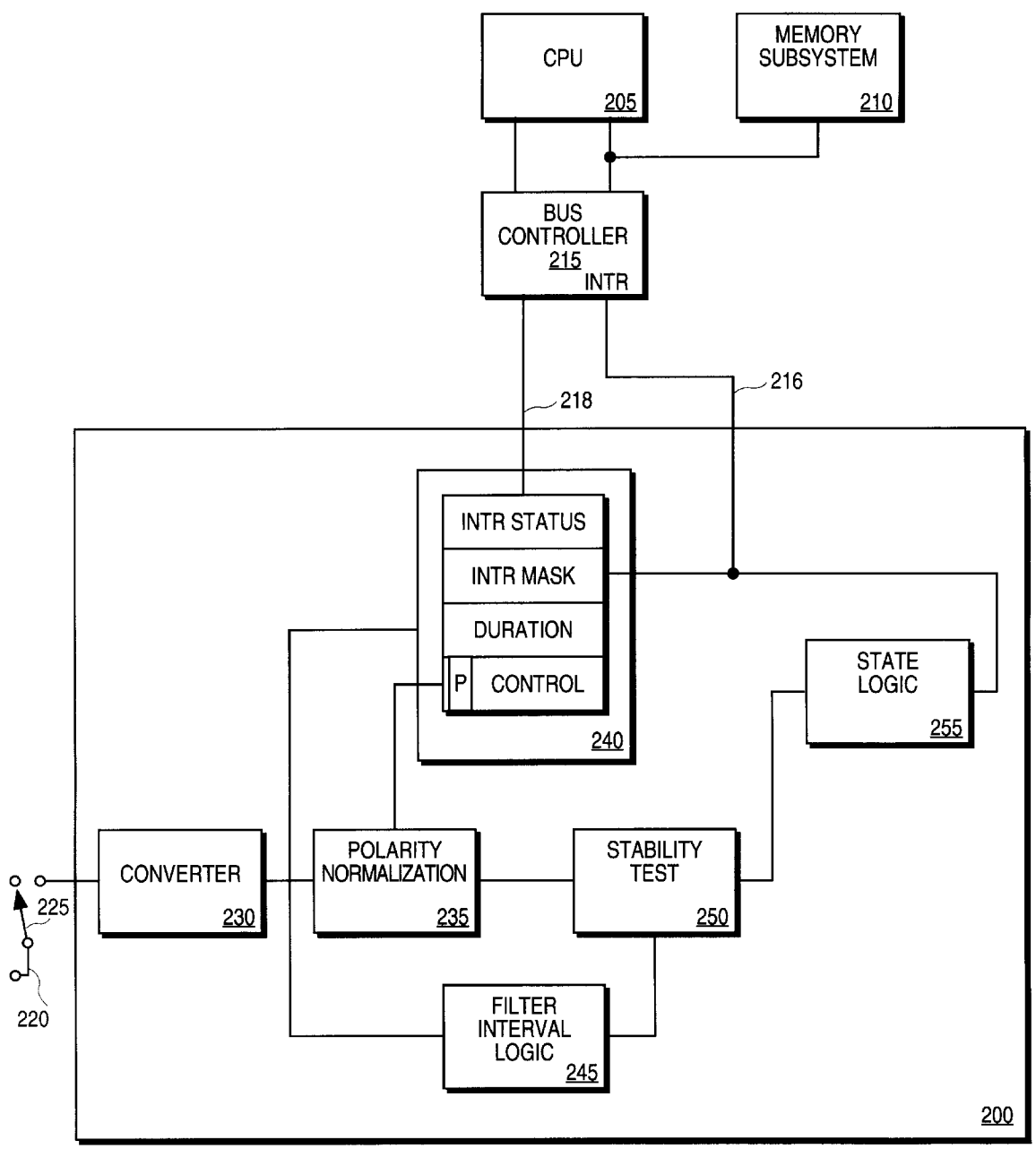
FIG. 2 illustrates a computer system utilizing the programmable digital filter of the present invention.

A digital filter of the present invention is illustrated in FIG. 1. This digital filter detects a predefined pattern over a programmably variable duration. This filter provides the flexibility necessary to adapt to differing signals, yet requires only minimal initialization. When used as part of a peripheral device in a computer system as illustrated in FIG. 2, this filter can be programmed by the computer system and can interrupt the computer system upon detection of a specified condition. Through a plurality of registers, the digital filter can cooperate to mask or provide information from an incoming signal.

As detailed in FIG. 1, a digital filter of the present invention includes an input normalization circuit 114, a stability test circuit 100, a filter interval circuit 120, and a control circuit 140. These elements cooperate to process an input signal received on an input node 101 to generate a change state signal on change state output 160 and a stable state signal on a stable state output 155.

The input normalization circuit 114 is designed to isolate the pattern matching circuits of the stability test circuit from the input signal received on the input node 101. Accordingly, the stability test circuit 100 does not need to be altered when the input node is coupled to receive new input signals. The input normalization circuit 114 may perform a variety of mathematical functions such as addition, subtraction, or complementing. This provides a normalized input signal which can immediately be processed by the stability test circuit 100. In one embodiment, the input normalization circuit is simply a polarity normalization circuit which is coupled to receive a polarity bit from a register. An exclusive or gate can be used to form the polarity normalization circuit. In other embodiments, a mathematical function chosen using a register normalizes the input signal.

The normalized input signal generated by the input normalization circuit is coupled to a shift register 102 of the stability test circuit 100. The shift register stores a plurality of samples (N bits) in response to a sample shift enable signal received from the filter interval circuit 120 on a sample shift enable line 121. The shift register is necessary to store the plurality of samples until they are compared using a pattern matching circuit. Any type of shift register or set of registers and appropriate control logic which can sequentially receive sampled values could be used.

A first pattern match circuit 104 and a second pattern match circuit 106 receive in parallel the plurality of samples from the shift register. In this embodiment, the pattern matching done by the first and second pattern matching circuits determines whether the plurality of samples includes only a consistent logic value. A stable high circuit determines whether all of the sampled values are a high logic value, and a stable low circuit determines whether all sampled values are a low logic value.

In this embodiment, the first pattern match circuit 104, the stable high circuit, is an and gate which generates a stable high signal. The stable high signal is coupled to the J input of a JK flip-flop 110 and its assertion sets the JK flip-flop output to a high level at the next clock edge. Also in this embodiment, the second pattern match circuit 106, the stable low circuit, is a nor gate which generates a stable low signal coupled to a K input of the JK flip-flop. When asserted, the stable low signal resets the JK flip-flop output to a low logic level at the next clock edge. The JK flip-flop is a stable input circuit which generates a stable input signal on a stable input line 112. As a stable input circuit, this JK flip-flop indicates at its output the last stable signal level observed on the input node to the digital filter. That is, when neither the stable high signal nor the stable low signal are asserted at a clock edge, the JK flip-flop maintains the same output level.

In other embodiments, other predetermined patterns can be detected. These patterns can either be wired into hardware, loaded into a register of a pattern match circuit, or selected from a plurality of possible matching patterns. In these embodiments, the pattern match outputs are fed directly to the control circuit 140 rather than using a stable input circuit (JK flip-flop 110). In an embodiment where it is desired only to detect when a pattern match has occurred, a logical or may be performed of all of the pattern match outputs. In this case, only the result is passed to the control circuit 140.

Whether or not a pattern match occurs for a particular input signal depends in part on the interval at which the input signal is sampled. In this embodiment, the filter interval circuit 120 dictates the frequency at which the shift register samples the normalized input signal. The filter interval circuit includes a filter duration register 124, a comparator 126, and an interval counter 122. The filter duration register is coupled to receive a filter duration value from a data bus which comprises at least one data line. The illustrated filter duration register includes a write enable and a clock input. The output of the filter duration register is coupled to the comparator 126 which compares the filter duration value to an interval count provided by the interval counter. If the interval count is greater than or equal to the filter duration value, the comparator clears the counter 122 and generates a sample enable signal on line 121 causing the shift register 102 to sample the normalized input. The interval counter also has a clock input and has a counter enable input which is coupled to receive a filter timebase signal.

In one embodiment, the filter is used to detect a stable on/off hook signal from an analog telephone line. In this embodiment, the clock inputs of the interval counter 122, the JK flip-flop 110, and the filter duration register 124 receive a 30 MHz clock. The filter timebase is a signal having a period of 125 microseconds and an active high time equal to that of the 30 MHz clock. This results in the interval counter incrementing its count once every 125 microseconds. With a filter duration register having eight bits, the comparator can trigger sampling of the normalized input signal by the shift register at an interval of 1 to 255 times the filter timebase interval of 125 microseconds. In this embodiment, a default value of sixteen, which may be overwritten, is stored in the duration register 124.

Primarily, the filter interval circuit 120 operates to provide a sample shift enable signal on the sample shift enable signal line 121. The sample shift enable signal is also coupled to a CLR input of the counter thereby resetting the counter when the count is greater than or equal to the value stored in the filter duration register 124. Any of a number of counter type circuits could be used to generate the sample shift enable signal. Additionally, the comparator could operate to generate the sample enable signal only when the filter duration value equals the interval count if either the interval counter is reset before counting begins, or the timing of the first sample is not crucial.

The control circuit 140 provides overall control for the digital filter and includes state logic 145 and a register 150. The control circuit is coupled to receive data from the data bus, and the register can be loaded when a write enable signal EN is activated. The control circuit is coupled to the stable input line 112 and processes the stable input signal from the stability test circuit 100. The state logic maintains the present stable input value and the last stable input value and determines whether a change in the input value has occurred. If so, this is indicated by a change state signal on the change state output 160. The present stable input value is continuously reflected on the stable state output 155.

Thus, the state logic in cooperation with the stable input circuit only generates a change state signal and only outputs a new stable state signal when the input signal to the digital filter transitions from that which the filter determines to be a first stable state (either a high or a low) to that which the filter determines to be a second stable state (either a high or a low, but opposite the first stable state). Either or both of the stable state and change state outputs may be masked by using the register 150. This may be especially useful when one of the outputs generates an interrupt for a processor because further interrupts may need to be masked until that first interrupt is served.

FIG. 2 illustrates the digital filter of the present invention used in a peripheral device 200 in a computer system. The computer system comprises a processor 205, a memory subsystem 210, a bus controller 215, and the peripheral device 200. The processor is coupled to exchange data and addresses with the memory subsystem and the bus controller. The bus controller allows the peripheral device to exchange addresses and data with the processor and couples the peripheral device to interrupt the processor.

The peripheral device includes a plurality of registers which receive data values from the processor over a bus 218.

These registers include an interrupt status register, an interrupt mask register, a duration register, and a control register. The control register includes a polarity compensation bit (P) which defines the operation of a polarity normalization circuit 235. The duration register defines a sampling interval for a filter interval circuit 245. A value loaded into the duration register sets the time between samples of the polarity normalization circuit output.

The polarity normalization circuit itself is coupled to receive a digital signal from a converter 230. The converter is coupled to a mechanical switch 225 connecting the converter to an input line 220. As previously discussed, the mechanical switch, may be a telephone hook switch, the input line may be an analog telephone line, and the stable states to be detected by the digital filter may be the on hook state and off hook state of the telephone. Each state is represented by either by a high logic or a low logic value. False transitions between any true change of state due to the bouncing of the mechanical switch are removed by the digital filter.

It should be noted that the converter 230 can perform level shifting or other processing which reflects, at appropriate signaling levels, the incoming signal from the input line 220 including the bounce of the mechanical switch 225. Here, the polarity normalization circuit improves flexibility with respect to both the converter 230 and the device ultimately connected through the mechanical switch. The output of this polarity normalization circuit is coupled to a stability test circuit 250 which is then coupled to state logic 255. The state logic 255 is coupled to an interrupt line to interrupt the processor through the bus controller 215 when the input line switches from first stable state to second stable state.

The interrupt mask register may be used to prevent the state logic from interrupting the processor. For example, if a first interrupt has been generated by the state logic, the interrupt mask can be set such that a second interrupt cannot be generated until the first interrupt is served. An interrupt generated by the state logic also updates the interrupt status register. One embodiment simply indicates that an interrupt has occurred on the interrupt line 216 and relies on the processor to retrieve interrupt information from the interrupt status register of the peripheral device.

This particular embodiment may be useful any time a peripheral device interrupts a processor responsive to a mechanical switch. In another embodiment, the peripheral device can be used to detect a predetermined pattern from any input source. Patterns other than stable logic levels can be detected by using other pattern matching circuits which detect these other predetermined patterns. Additionally, the programmable duration and programmable normalization of the input signal provide the flexibility to accommodate a variety of input devices.

Figure 3:
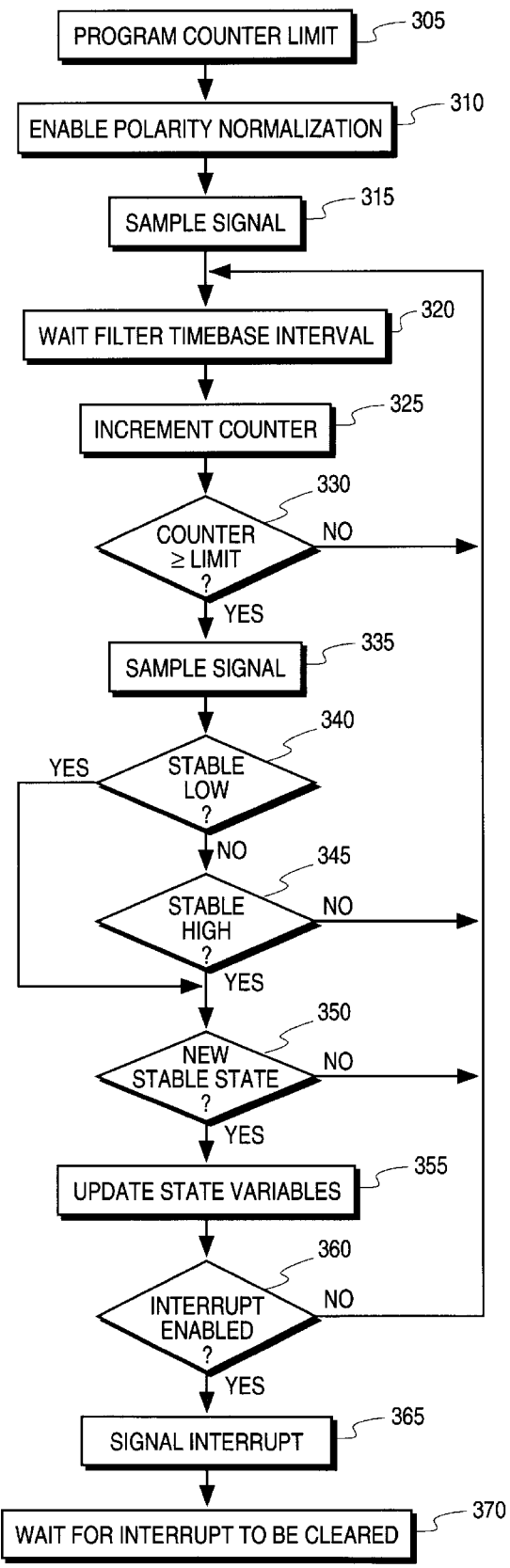
FIG. 3 is a flowchart demonstrating a method of filtering a signal according to the present invention.

FIG. 3 illustrates a method of stable interval detection in a computer system such as that shown in FIG. 2. In a programming step 305, the counter limit is programmed, setting the interval for sampling. This programming may be done in the computer system by writing to a particular memory location. Alternately, the filter duration may be set or programmed using mechanical switches, programmable logic devices, or other appropriate means. Next, the polarity normalization logic is enabled in step 310. This may be done automatically according to a default value stored in a control register. Alternately, a value may be loaded into the control register which sets a polarity compensation bit enabling normalization of the incoming signal. The signal is sampled in sampling step 315. The sampling may be done by shift register or another appropriate register which can store several sampled values.

After waiting the appropriate amount of time in step 320, the counter is incremented in step 325. If the counter has reached or exceeded the limit defined by the value loaded into the filter duration register, the signal is sampled again in step 335. Otherwise, a decision is made in step 330 to return to step 320.

This sampling procedure may be repeated a number of times to obtain enough samples to detect the appropriate pattern. In one embodiment, eight samples are deemed sufficient to indicate a stable signal. In step 340, the sample values are analyzed to determine if a stable low has been captured. In step 345, the sampled values are analyzed to determine if a stable high has been captured. If neither a stable high nor stable low has been captured, the device returns to step 320. If a stable low or stable high has been detected, it is determined in step 350 whether the stable state detected represents a new stable state. If no new stable state has occurred then the device returns to step 320. If a new stable state has been detected, the state variables are updated in step 355.

If interrupts are masked using the interrupt mask register, no further action is taken and the device returns to step 320. If the interrupts are enabled an interrupt is signaled in step 365. Once this interrupt is signaled, the device will prevent further interrupts from being signaled by waiting for the interrupt to be cleared in step 370.

The steps in the flow chart of FIG. 3 have been laid out in an illustrative manner. It should be noted that several of these steps such as the detect stable low and detect stable high steps 340 and 345 are typically performed in parallel. Additionally, the counting of samples preferably continues independently of the stable interval detection and subsequent interrupt activity. Accordingly, rearrangement of the steps or parallel execution thereof are within the spirit and scope of the invention.

Thus, the digital filtering method and apparatus of the present invention provides for programmable pattern matching. While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A digital filter comprising:

an interval register coupled to receive an interval count;

a sample register coupled to receive a plurality of samples of an input signal sampled at a sampling interval determined by said interval count;

a plurality of pattern matching circuits coupled to generate a pattern match output if said plurality of samples matches one of a plurality of predetermined patterns; and state logic coupled to generate a change state signal if said pattern match output indicates a new match.

2. The digital filter of claim 1 wherein said plurality of pattern matching circuits comprises:

a stable high test circuit which asserts a stable high signal as the pattern match output if said plurality of samples are all a high logic level; and a stable low test circuit which asserts a stable low signal as the pattern match output if said plurality of samples are all a low logic level.

3. The digital filter of claim 1 further comprising:
a filter interval circuit which is coupled to said interval register and said sample register and provides said sample register with a sample enable signal at said sampling interval.

4. A programmable digital filter comprising:
a register which is coupled to sample an input signal in response to a sample enable signal, and which contains a plurality of samples of said input signal;
a stability test circuit which is coupled to receive said plurality of samples in parallel and has a stability test output indicating whether said plurality of samples are all a consistent logic value;
a programmable filter duration register which contains a duration indicator; and
a filter interval circuit coupled to provide said sample enable signal at a frequency defined by said duration indicator.

5. The programmable digital filter of claim 4 wherein the register is a shift register and the sample enable signal is a sample shift enable signal which causes the shift register to shift a plurality of sampled values and sample said input signal.

6. The programmable digital filter of claim 4 further comprising:
a control register which contains a polarity compensation bit; and
a programmable polarity normalization circuit which receives said input signal and couples a normalized input signal to said register using said polarity compensation bit.

7. The programmable digital filter of claim 4 wherein said stability test circuit comprises:
a stable high test circuit which asserts a stable high signal indicating whether said plurality of samples are all a high logic level; and
a stable low test circuit which asserts a stable low signal if said plurality of samples are all a low logic level.

8. The programmable digital filter of claim 4 further comprising:
a state circuit which is coupled to said stability test output and which activates a change state output when said input signal transitions from a first stable state to a second stable state.

9. The programmable digital filter of claim 8 wherein the first stable state occurs when said plurality of samples are a high logic level and said second stable state occurs when said plurality of samples are a low logic level.

10. The programmable digital filter of claim 7 further comprising:
a stable input circuit which stores a last stable input value and generates a present stable input value which indicates the high logic level in response to the stable high signal, the low logic level in response to the stable low signal, and the last stable input value in response to the stable high signal and the stable low signal being deasserted.

11. The programmable digital filter of claim 7 further comprising:
a JK flip flop having a J input coupled to receive the stable high signal, a K input coupled to receive the stable low signal, and a Q output providing a present stable input value.

12. The programmable digital filter of claim 10 further comprising:

a state circuit which is coupled to receive said present stable input value, contains a past stable input value, and generates a change state output when said present stable input value differs from said past stable input value.

13. The programmable digital filter of claim 8 wherein said change state output is an interrupt signal masked by a bit in an interrupt mask register.

14. In a computer system having a processor and a memory subsystem coupled to a bus comprising a plurality of address and data lines, a peripheral device coupled to said bus, coupled to receive an input signal, and coupled to interrupt said processor, the peripheral device comprising:
a filter duration register which is coupled to receive a filter duration value from the bus;
a filter interval circuit which is coupled to said filter duration register and provides a sampling signal at an interval determined using said filter duration register; and
a stability test circuit which is coupled to sample said input signal according to said sampling signal, and which generates a stability test output indicating whether a plurality of samples are all a consistent logic value, said peripheral device interrupting said processor responsive to said stability test output.

15. The peripheral device of claim 14 further comprising:
a state machine which receives the stability test output and interrupts said processor responsive to said stability test output if said input signal toggles from a first stable state to a second stable state.

16. The peripheral device of claim 15 further comprising:
an interrupt mask register which is coupled to receive an interrupt mask value from said bus and which is coupled to said state machine to selectably prevent said peripheral device from interrupting said processor according to said interrupt mask value.

17. The peripheral device of claim 14 further comprising:
a control register which contains a polarity bit which indicates an expected signal polarity; and
a polarity normalization circuit which is coupled to said control register and which receives said input signal and couples a normalized input signal to said stability test circuit.

18. The peripheral device of claim 14 wherein said filter duration register contains a default value unless overwritten by said computer system.

19. The peripheral device of claim 14 wherein said peripheral device is coupled to a secondary bus which is coupled to the processor through a bus controller.

20. The peripheral device of claim 14 wherein said input signal is derived from an analog telephone signal which is coupled to said stability test circuit using a level shifting converter, and wherein said stability test circuit debounces said input signal.

21. The peripheral device of claim 15 wherein the input signal contains signal bounce from a mechanical switch and the peripheral device cooperates to interrupt said processor only once each time said mechanical switch switches.

22. A method of providing stable interval detection comprising the steps of:
(a) sampling one of a plurality of sampled values;
(b) waiting a predetermined amount of time;
(c) repeating steps (a) and (b) for said plurality of sampled values;
(d) determining if said sampled values represent a stable state; and (e) generating an interrupt signal if said stable state differs from a prior stable state.

23. The method of claim 22 wherein step (b) further comprises the step of:

counting to a predetermined number.

24. The method of claim 22 wherein step (a) further comprises the step of:

loading said one of said plurality of sampled values into a register responsive to a sample enable signal.

25. The method of claim 23 wherein said predetermined number is a programmable filter interval.

26. The method of claim 22 wherein step (d) further comprises the steps of:

(i) generating a stable high signal if all of said plurality of sampled values are a high logic level; and (ii) generating a stable low signal if all of said plurality of sampled values are a low logic level.

27. The method of claim 22 wherein the step (e) further comprises the steps of:

(i) testing a programmable interrupt mask register;

(ii) holding said interrupt signal active; and (iii) masking further interrupts until said interrupt is serviced.

* * * * *